United States Patent [19]

Walsh et al.

[11] Patent Number: 4,760,327
[45] Date of Patent: Jul. 26, 1988

[54] CABLE STATUS TESTING

[75] Inventors: Thomas D. Walsh, Braintree; Nicholas Reinhardt, Lexington; James M. Feldman, Newton, all of Mass.

[73] Assignee: Boston Edison Company, Boston, Mass.

[21] Appl. No.: 928,872

[22] Filed: Nov. 10, 1986

[51] Int. Cl.⁴ .............................................. G01R 31/02
[52] U.S. Cl. ............................... 324/66; 174/106 SC; 324/72.5
[58] Field of Search ......................... 324/66, 133, 72.5; 174/106 SC

[56] References Cited

U.S. PATENT DOCUMENTS

| | | | |
|---|---|---|---|
| 3,363,171 | 1/1968 | Sietmann et al. | 324/72.5 X |
| 3,390,331 | 6/1968 | Brown et al. | 174/11 BH |
| 3,576,493 | 4/1971 | Tachik et al. | 324/133 |

Primary Examiner—M. H. Paschall
Assistant Examiner—Morris Ginsburg
Attorney, Agent, or Firm—Kenway & Crowley

[57] ABSTRACT

A method and system for determining the status of power distribution cables which involves the removal of a plug from the sheath which is tiny relative to the size of the cable to expose an area of resistive material which may be probed to detect the presence or absence of a signal of predetermined frequency. The apparatus is equipped with self-testing circuits as well as circuits for determining resistance between the resistive layer and the sheath, whereby positive identification of the cable to be tested is assured. The apparatus is clamped directly to the cable and is controlled from a remote location, which protects the operator of the equipment. The plug removed from the sheath is cut and extracted by a tool which is also subject to remote control by the operator.

11 Claims, 2 Drawing Sheets

CABLE STATUS TESTING

This invention relates in general to the identification and detection of status of underground distribution cables, and in particular to the unambiguous non-destructive determination of the energized or de-energized condition of the current-carrying interior conductors of specific distribution cables.

BACKGROUND OF THE INVENTION

In typical urban power distribution systems, access to groups of underground cables is available at manholes which may be rather widely spaced. There may be many cables grouped in any particular manhole and, if work is to be performed on a specific cable of such a group, that cable must-be identified and de-energized before the work proceeds. Some simple methods of cable identification are practiced commonly and these include the use of tags or markers, the noting of manhole rack positions and comparison of ducts in adjacent manholes.

In those situations where terminations are accessible, a coded signal or one of special frequency can be applied to the cable and used to identify that cable at a remote position. This method is not available, of course, where cable terminations are totally inaccessible or sealed and insulated in the manhole. Even when a signal can be applied, misidentification may still occur because inexperienced operators may be confused by signal runoff to the sheath of adjacent cables. Most important, even if cable identification is successful, despite the problems noted, absolute proof that the cable is in de-energized condition is still lacking.

Cables of the type here under consideration usually include a central conductor and an outer metallic sheath separated by composite intermediate layers. Typically, a stranded copper center conductor is embedded in a high-resistivity screen layer which is surrounded by an insulating layer of rubber. A second high-resistivity screen layer is formed around the rubber insulating layer, usually by spiral-wound tape and an outermost layer, typically of lead, forms the metallic sheath about the tape-wound screen layer.

Positive proof that a cable is de-energized invariably requires making an opening at least in the outer sheath. When, for example, a cable is to be spliced, a straightforward simple test is to spear or cut the cable using a remote, hydraulically actuated ram. During cable penetration, personnel remain at a distance from the test point and are thus protected, but if it turns out that the cable is energized, an outage will result, and frequently serious damage will be done to the cable. The outage and ensuing expensive and time-consuming repairs which are then required are simply unacceptable.

With lead-sheathed cables, it is sometimes the practice to strip back the lead to expose the underlying shield tape. The shield tape may also be cut away to expose the underlying rubber insulation from which the status of the cable may be determined by a capacitively coupled probe. Should it prove to be "hot", the cable must be taken out of service, the damage to the cable must be repaired, and the process repeated until proper identification is made and the original project may be carried out.

Clearly, current methods of cable identification and cable status determination are time-consuming and expensive in terms of work involved and unintentional damage. Moreover, they frequently require the services of highly trained and skilled operators. Finally, in certain situations, there is considerable risk of injury to the operator of the cable testing equipment.

It is therefore a primary object of the present invention to provide an automatic remotely controlled machine and process for the non-destructive unambiguous determination of the status of distribution cables.

Another object of the present invention is to enable relatively unskilled and inexperienced operators to identify and determine the on/off status of underground distribution cables.

It is a further object of the invention to reduce the cost and avoid the damage associated with current methods of cable identification and status determination.

SUMMARY OF THE PRESENT INVENTION

In the present invention, the outer lead sheath of the cable is breached as in the prior art. However, the breach in the sheath is an opening of such small dimensions that the electrical integrity of the cable is not diminished. The tiny area of the tape-wound high-resistivity screen layer immediately beneath the sheath which is thus exposed is probed to detect the presence or absence of a flow of charging current which would indicate the on/off status of the cable is determined. If no such charging currents are detected, the cable is spiked as conclusive proof that the cable is not energized and work on the cable may proceed. Conversely, if the cable proves to be "hot", only a tiny opening exists which may easily be repaired without taking the cable out of service and which does not affect the basic integrity of the cable.

The identification and test procedure is initiated by the lineman clamping the jaws of a battery-operated test apparatus onto the cable. He may then self-test the apparatus by applying known voltages and resistances available in the machine to the inputs. The lineman then departs the manhole and starts a motor in the machine by remote control. The motor pushes and twists a hollow tool of sharpened, slightly tapered steel tube into the lead sheath. When the tool reaches the screen layer, further penetration ceases and a small plug of lead becomes lodged in the tool. The tool is then retracted, leaving a small area of resistive tape screen layer exposed in the opening left by the plug removal. The plug may then be ejected from the tool and a probe may be pressed forward against the tape. Electrical tests may then be made; first, for example, the resistance between the probe and ground may be checked to make certain that it lies between acceptable limits. Should the resistance be outside those limits, the operator has prima facie knowledge that the wrong cable has been penetrated.

Assuming the resistance is within limits, however, the operator next initiates a test step to detect the presence of a rather small voltage at the power frequency on the tape. The presence of such a voltage indicates that the central conductor of the cable is energized. Given a positive result, the operator does no further work because, again, either the wrong cable has been penetrated, an improper switch setting has been discovered, or some other unknown problem has arisen. Whatever the case, that problem must be resolved before proceeding.

Conversely, if no voltage is detected, cable spiking as proof positive that the cable is de-energized takes place as a final step. This is best accomplished by utilizing the test probe as a spiking tool or replacing the test probe with a different spiking tool with forward pressure being applied to force the tool through the insulation and into the central conductor of the cable.

For a better understanding of the present invention, together with other and further objects, features and advantages, reference should be made to the following description of a preferred embodiment and the appended drawing in which.

DESCRIPTION OF PREFERRED EMBODIMENT

Figure 1:
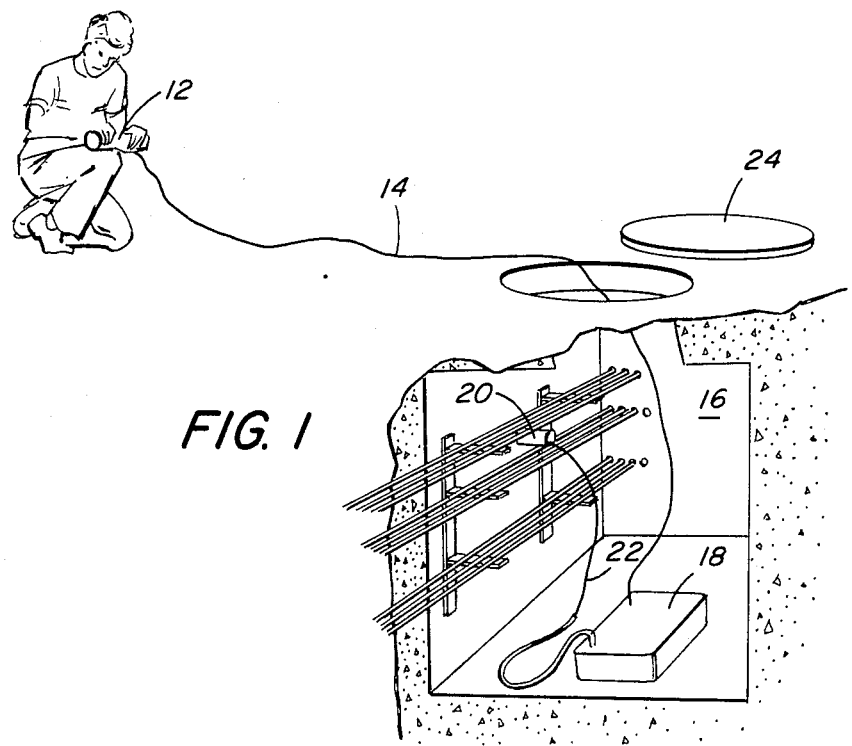
FIG. 1 is a pictorial view, partly in section, illustrating the operation of a test system in accordance with the present invention.

The pictorial view in FIG. 1 illustrates an operator holding a remote control unit 12 from which a control and observation line 14 extends into a manhole 16. Resting in the manhole is a machine housed in a container 18, to which the line 14 connects. In this instance, a separate clamping unit 20 is shown connected by a line 22 to the machine housing 18, but in the preferred embodiment of the invention the clamping unit 20 is mounted on the machine housing 18.

The operator first gains access to the manhole by removing the cover 24 and clamps the machine to the cable which may have been tentatively identified as one to be worked upon by a tag, marker or other rough identifying criteria. He then tests the machine for proper operation and retreats from the manhole to a position sufficiently distant to avoid any possible injury to himself. He is then ready to activate the machine to commence operations on the selected cable.

Figure 2:
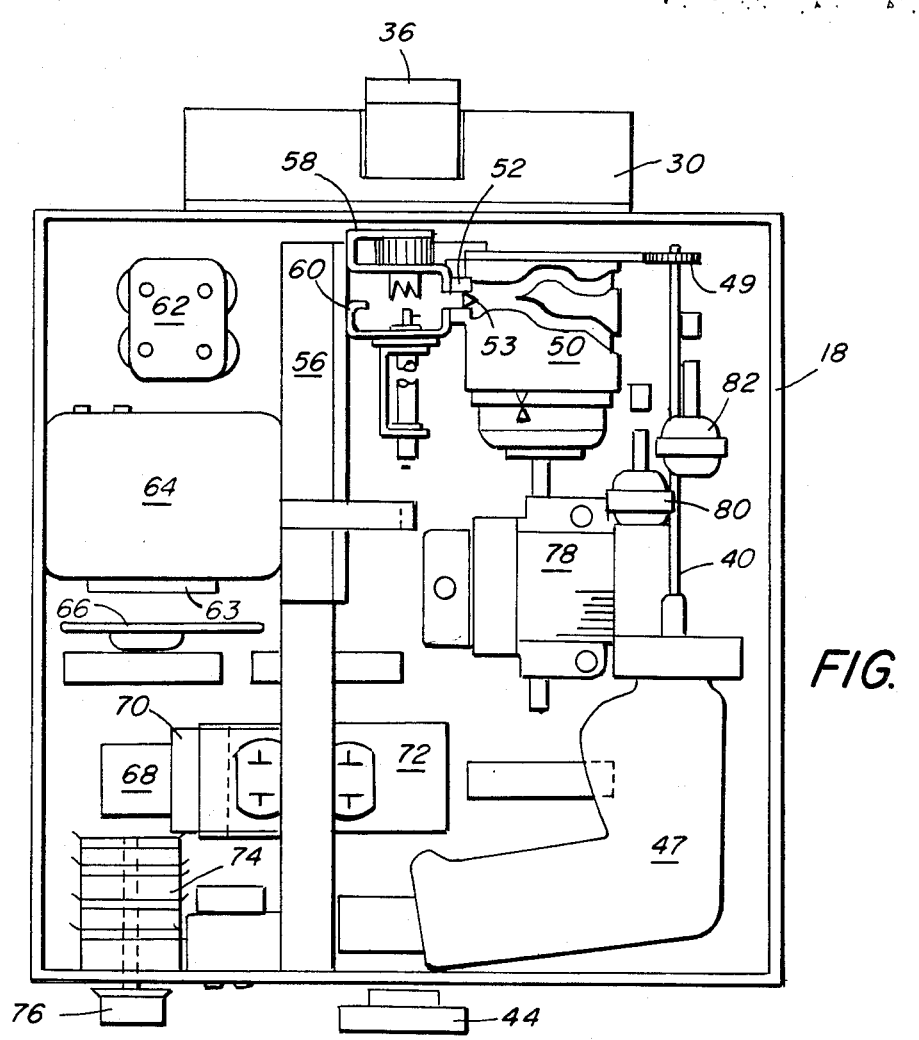
FIG. 2 is a top view of the components of the testing apparatus.
Figure 3:
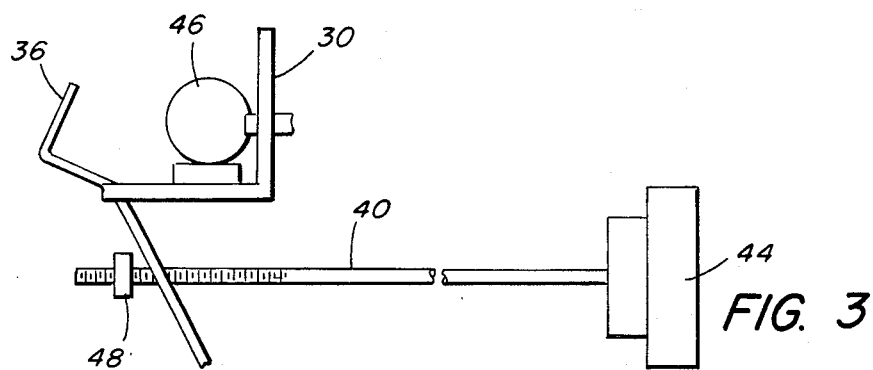
FIG. 3 is a fragmentary side view of one form of cable clamp used in the invention.
Figure 4:
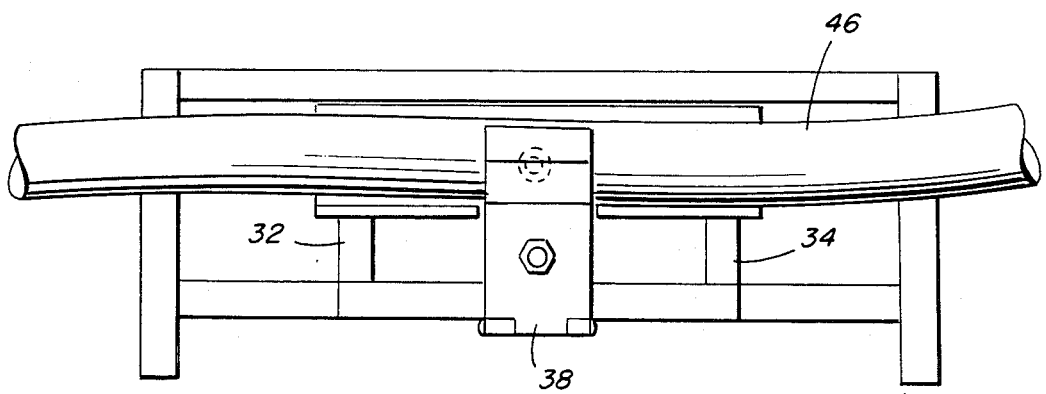
FIG. 4 is a front view of the clamp of FIG. 3.

FIG. 2 shows the layout of machine components in a machine design in which the clamp is mounted directly on the machine. The clamp, shown in greater detail in FIGS. 3 and 4, includes a fixed bed 30 formed of angle iron and attached by posts 32 and 34 to the front of the machine 18. A movable clamp jaw 36 is hinged at 38 to the fixed clamp bed 30. The lower end of the jaw 36 is threaded to receive a drive screw 40 having a stop nut 48 at one end and an adjusting knob 44 at its other end beyond the housing 18. A cable 46 may be seen in position for engagement in the clamp.

Reverting to FIG. 2, there may be seen a high-torque, battery-operated drive motor 47 mounted at the lower right. A conventional hand drill has proven suitable for this purpose. Its output shaft 40 drives a gear train 49 which rotates a two-track barrel cam 50. Cam followers 52 and 53 derive their motion from the barrel cam 50 to put a cutter, a probe, and a spiking tool through motions which perform the operations on the cable detailed hereinbelow.

The control system need not be mechanical in nature as exemplified by the cam-cam follower system but may be constituted by a suitably programmed mini-computer or other electrical system.

A subchassis 56 is mounted within the machine enclosure 18 to serve as a guide track for the reciprocal motion of a cutter carriage 58 and a probe carriage 60. Rechargeable batteries 62 are mounted at the upper left of the machine housing 18. These batteries supply the power for the electronic components 63 of the apparatus which are contained in a compartment, the cover of which serves as a display panel 64. The electronic components 63 may include a narrow band filter for AC detection and a pair of buffered bridge circuits for determining if the resistance from the outer screen tape surface to around is within acceptable limits.

A number of indicator lamps mounted on the display panel 64 provide information on various conditions and the status of various operations being performed by the machine as detailed below. A generator of 60 Hz in the form of an oscillator 66 is mounted adjacent the display panel 64. Such a source is necessary to provide self-test functions in the machine.

At a point below the generator 66 is a switching unit 68, main and auxiliary batteries 70 for providing power to drive the motor 47, and a battery charger 72 for maintaining all batteries in a charged condition. A convenience outlet for 117 volt AC power is made available at the battery charger location.

Ganged multi-position function switches 74 are positioned in the lower left corner of the housing 18 and these are manually rotatable by means of an external knob 76 to self-test the operations of the apparatus before an actual cable test is performed. In the case of actually performing cable tests, a series of plate cams and switches 78 rotatable with the barrel cam 50 serves to interconnect various circuits at the appropriate times to initiate motions, make necessary tests, and detect voltages at the cable test site. Adjacent the plate cams 78 are two pressure responsive switches 80 and 82 connected to, and operable by means of, the control line 14 by the lineman at the control unit 12 at the remote position. The unit 12 may be in the form of squeeze bulbs connected through pneumatic tubes in the line 14 to pistons which operate switches 80 and 82 respectively. Those arrangements may be similar to shutter release mechanisms of the type utilized in cameras. Parenthetically, it should be noted that the line 14 may also include a fiber optic cable having a viewing end for use by the operator at the control unit 12 and a pick-up end adjacent the display panel 64 in order that the operator may continuously monitor of the status of the cable-testing operation.

Figure 5:
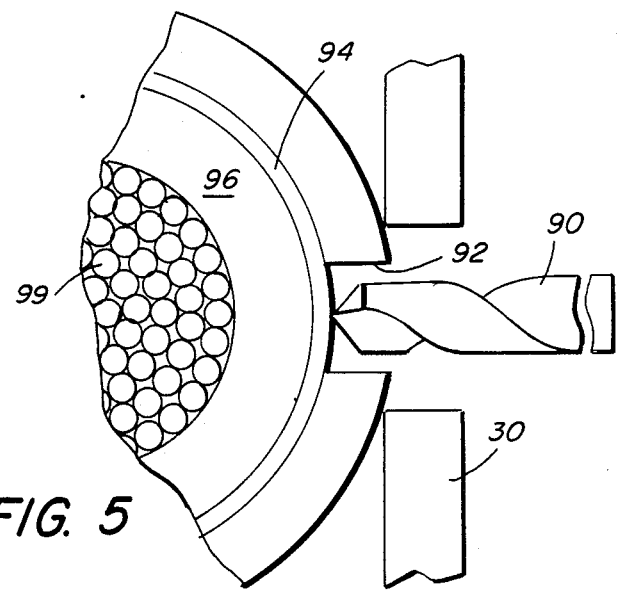
FIG. 5 illustrates cable spiking.

FIG. 5 illustrates schematically the cable spiking step. The spike 90, in the form of a hardened steel pin or a self-tapping screw, is advanced through an opening in the fixed bed 30 of the clamp. The spiking screw is further advanced through the aligned opening 92 left by the removal of the plug from the lead sheath of the cable. It is then rotated and moved forward through the resistivity layer 94., the insulating layer 96, the final screen layer, and into threaded penetration of the interior of the stranded central conductor 99 of the cable.

In operating the apparatus, the lineman first makes sure that the barrel cam 50 is at the starting point. If not, he advances it as needed by manipulating a jogging switch to energize the electric drive. Once the barrel cam is in the starting position, the cable to be tested is clamped between the fixed jaw 30 and the movable jaw 36 which is tightened by rotating the large knob 44 at the front of the housing 18. Preliminary testing may then begin.

First, a test-of-function is performed by rotating the switch 74 through its several positions from the basic OFF position. One position checks the response of the circuit electronics 63 to too high a resistance; then, to too low a resistance; and finally, to a calculated proper resistance. If the response is positive to the test of proper resistance, an AC signal from the oscillator 66 is applied to the voltage-test circuit. Each of the appropriate indicators on the display panel 64 must show the correct response for its function. The display panel has a number of lamps or LED's which may have both color and positional encoding. For the AC test, a quantitative meter indication may also be provided. Assuming all is in proper working order, the technician rotates the switch into the RUN position, picks up the control unit 12, and departs the manhole.

Once out of the manhole, he may begin the actual cable test using the remote control unit. The unit may include two pneumatic squeeze balls. He squeezes the first ball for a second. The machine goes through the hole-punching phase for about 30 seconds. First, the hollow tool is rotated and advanced into the lead sheath and a lead plug is cut free of he jacket. The tool is retracted over a central pin or a small shaft may be advanced through the tool to eject the plug. A probe, which may be the spike 90 is then advanced into contact with the semiconductor tape and is switched to a voltage test phase in which tape resistance is checked to make certain it lies within acceptable limits. That being the case, the test for the presence of an AC voltage at the power frequency is begun. The display panel is so wired that if such an AC voltage at the power frequency is detected, the line is assumed to be hot, and a red LED will be lit. If, and only if, the red LED is and remains unlit, the technician will proceed to spike the cable.

This last and most definitive step is deliberately made somewhat difficult to perform. The technician must squeeze both balls simultaneously; neither single ball can alone set up the spiking. Not even the first double-squeeze completes the task; both balls must be squeezed simultaneously again. Then, the machine rotates and presses the spiking tool through the composite layers and into the center conductor of the cable, assuring that the cable is dead. At this point, the technician may return to the manhole and continue with his operations on the cable.

As noted, the removal of the lead plug is accomplished by pushing and twisting a sharpened, slightly tapered, tubular steel tool into the lead. The tool may be made more effective if a small bevel is formed inside the tube to a distance just short of complete penetration of the lead sheath. Sheath thickness does not vary greatly from one sample to another, regardless of cable diameter, so this distance is reasonably well defined. As the lead extrudes up into the tube, it blooms and flows out to the sidewalls. The cutting goes smoothly enough, but there is considerable friction on the sidewall. When the tool is almost through the sheath and the lead reaches the end of the bevel, it galls against it and the torque increases dramatically. The drill torque is sufficient to tear the remaining thin layer of lead, freeing the plug. The tool configuration is thus changed from a sharp, thin-walled coring-drill into a thick, blunt cylinder that has no tendency whatsoever to cut or penetrate the resilient tape layer. Use of the bevel with the resulting abrupt change in configuration lessens the need for any critical sensing of the instant of breakthrough and makes the penetration self-arresting.

Once the lead plug is free, the cutting tool is retracted back so that the lead plug is pressed against a centrally disposed shaft or pin. This ejects the plug, which falls harmlessly out of the coring-drill.

The probe is then brought forward and pressed with modest pressure against the tape. The probe is not rotated but simply contacts the tape. After the probe is withdrawn, the final step of spiking the cable is performed by rotating and pressing forward the spiking tool or screw through the outer layers and into the central conductor. It is noteworthy that it takes very little pressure when the screw is rotated (but enormous pressure, when it is not) to penetrate the rubber. Here again, the material itself provides a sharp differentiation between two steps that make it easier to separate these two sequential operations. The screw finally penetrates the central conductor where it may remain and serve to ground the conductor to the sheath.

The electronic components 63 are of conventional design and may be incorporated in a pair of small circuit boards mounted in the compartment beneath the display panel 64. One of these circuit boards carries an AC detector and the other a pair of buffered resistance bridges. The compartment may have terminals and jacks mounted on its wall for connecting battery power, probe leads, and an external meter. The lights mounted on the display panel 64 may conveniently be several light emitting diodes (LED's) of differing colors.

The resistance of the screen tape layer is measured between the point of contact of the probe with the tape and the lead sheath of the cable. This may be done in a number of different ways, but the preferred method is to utilize a pair of buffered DC bridge circuits to determine if the tape resistance is within reasonable bounds.

Operational amplifiers utilizing field-effect transistors serve as unity gain buffers to provide the necessary impedance transformation in the resistance bridge circuits. The voltages across the pair of bridges are tested by a pair of comparators. One of the comparators detects a resistance which is too high, and the other a resistance which is too low. Low resistance can be caused by a number of factors. For example, the tape layer may have deteriorated because of the intrusion of a foreign substance such as salt water. Lead fragments from the cutting operation may become imbedded in the tape or the extracted lead plug may fail to clear the sheath, in which case the low resistance may amount to a complete short circuit. On the other hand, high resistance might be encountered if contact with the resistive tape is not good, if the wrong type of cable is being penetrated, or if some mechanical problem resulting in an open circuit has arisen.

The AC detector may also be conventional in nature, but preferably has a very high input impedance which may be assured by the use of field-effect transistor amplifiers. The amplifier may have four stages, the first providing gain and buffering, the middle two stages forming an active filter, and the output stage isolating the filter and providing some gain. The output of the final stage can be directly indicated by an AC meter.

Also at the output of the final stage is a comparator which is triggered whenever the output signal of the amplifier exceeds a predetermined threshold value. When that threshold value is exceeded, the red LED is turned on. The red LED remains unlit only so long as the output signal is below that threshold value.

The invention has been described in connection with a lead-sheathed cable with which it finds useful application. The status of cables of other designs may also be determined utilizing the teaching of the invention by making appropriate changes of certain elements of the invention. Accordingly, the invention should not be limited to the details of the disclosed preferred embodiment, but only by the spirit and scope of the appended claims.

What is claimed is:

1. A method for determining the on/off status of a power distribution cable having a central conductor, an intermediate layer including at least a layer of resistive material surrounding said central conductor and an outer conductive sheath which comprises the steps of cutting and removing a plug from said sheath to expose an area of said layer of resistive material and testing between a surface of said area and said sheath to determine the presence or absence of a signal voltage of a predetermined frequency at said area.

2. A method as defined in claim 1, wherein said conductive sheath is lead, said plug being removed by steps of advancing a hollow tool into said sheath to separate said plug from said sheath and engage said plug in said tool, retracting said tool from said sheath to leave an opening in said sheath and ejecting said plug from said tool.

3. A method as defined in claim 2, wherein said testing is performed by the steps of advancing a probe through said opening in said sheath to reach said area to form a first contact and using said conductive sheath as a second contact of a test contact pair.

4. A method as defined in claim 1 and further including the step of driving a grounding spike through said area of said layer of resistive material and into said central conductor.

5. A method as defined in claim 1 and including preliminary steps of clamping test apparatus to said power distribution cable before removing said plug from said sheath and testing the electrical resistivity between said area of said layer of resistive material and said sheath before said testing to determine the presence or absence of a signal voltage.

6. A method as defined in claim 5 wherein all steps subsequent to said steps of clamping are controlled from a point remote from said power distribution cable.

7. Apparatus for determining the on/off status of a power distribution cable having at least a central conductor of a predetermined diameter, a layer of resistive insulating material and an outer sheath comprising a sequential drive means responsive to said sequential drive for removing a portion of said sheath to expose an area of said resistive material of diameter smaller than said predetermined diameter, probe means for testing between said area and said sheath for the presence or absence of a signal of predetermined frequency, and means for spiking said central conductor to connect it to said sheath in the absence of said signal.

8. Apparatus as defined in claim 7 wherein said means for removing said portion of said sheath comprises a hollow tool, means for advancing said tool into said sheath to cut a plug therefrom, and means for retracting said tool from said sheath to disengage said plug from said sheath.

9. Apparatus as defined in claim 8 wherein said sheath is composed of lead through which said hollow tool cuts relatively freely and said resistive layer is of elastic material which resists cutting action of said hollow tool.

10. Apparatus as defined in claim 8 including apparatus for clamping said power cable in position adjacent said hollow tool, a drive motor and system for sequentially advancing and retracting said hollow tool relative to said cable and for sequentially advancing and retracting said probe means relative to said area of said resistive material.

11. Apparatus as defined in claim 10 and further including a spiking tool for penetrating said layer of resistive material and said central conductor and means responsive to said drive motor and system for actuating said spiking tool after retraction of said probe means.

* * * * *